United States Patent [19]

Itoh

[11] Patent Number: 5,561,373
[45] Date of Patent: Oct. 1, 1996

[54] METHOD AND DEVICE FOR DETECTING ELECTROSTATIC STRESS APPLIED TO A PRODUCT SEMICONDUCTOR DEVICE DURING EACH PRODUCTION PROCESS

[75] Inventor: Seigo Itoh, Kasugai, Japan

[73] Assignees: Fujitsu Limited; Fujitsu VLSI Limited, both of Japan

[21] Appl. No.: 456,614

[22] Filed: Jun. 1, 1995

Related U.S. Application Data

[63] Continuation of Ser. No. 773,276, Oct. 9, 1991, abandoned.

[30] Foreign Application Priority Data

Oct. 9, 1990 [JP] Japan ................... 2-271784

[51] Int. Cl.[6] .................... G01R 31/04; G01R 31/02
[52] U.S. Cl. ............... 324/158.1; 324/73.1; 324/765
[58] Field of Search ............. 324/158.1, 73.1, 324/133, 122, 765; 361/212, 111, 91, 56; 257/48, 40; 364/579; 437/8; 340/662

[56] References Cited

U.S. PATENT DOCUMENTS

| | | | |
|---|---|---|---|
| 3,436,751 | 4/1969 | Hron et al. | 340/662 |
| 3,795,863 | 3/1974 | Umeda et al. | 324/122 |
| 4,763,184 | 8/1988 | Krieger et al. | 357/51 |
| 4,779,041 | 10/1988 | Williamson, Jr. | 324/158 R |
| 4,839,768 | 6/1989 | Daniel et al. | 361/56 |
| 4,875,130 | 10/1989 | Huard | 361/111 |
| 4,922,371 | 5/1990 | Gray et al. | 361/111 |
| 4,930,037 | 5/1990 | Woo | 361/111 |
| 5,051,860 | 9/1991 | Lee et al. | 361/111 |
| 5,059,831 | 10/1991 | Itoh | 361/212 |
| 5,086,365 | 2/1992 | Lien | 361/111 |

FOREIGN PATENT DOCUMENTS

| | | | |
|---|---|---|---|
| 57-40951 | 3/1982 | Japan | H01L 21/66 |
| 63-102237 | 5/1988 | Japan | H01L 21/66 |
| 63-257241 | 10/1988 | Japan | H01L 21/66 |

*Primary Examiner*—Vinh P. Nguyen
*Attorney, Agent, or Firm*—Staas & Halsey

[57] ABSTRACT

A stress-detection semiconductor device has a stress detection circuit for detecting electrostatic stress applied to a product semiconductor device. The stress detection circuit has a plurality of stress detection units each including a resistor and a stress registering element connected to the resistor, and a resistance value of the resistor is specified as a different value by each of the plurality of stress detection units. The stress-detection semiconductor device is accompanied by a plurality of product semiconductor devices and sent through a plurality of production processes, and the electrostatic stress applied to the product semiconductor devices during each of the production processes is detected by measuring and comparing characteristics of the stress registering element before and after each of the production processes. Consequently, an inferior portion of a manufacturing device wherein an excessive electrostatic stress is applied to the product semiconductor device can be easily determined, and further, an inferior portion of a design of the semiconductor device can be easily improved.

26 Claims, 10 Drawing Sheets

——— : BEFORE APPLYING ELECTROSTATIC STRESS

—·—· : AFTER APPLYING ELECTROSTATIC STRESS

METHOD AND DEVICE FOR DETECTING ELECTROSTATIC STRESS APPLIED TO A PRODUCT SEMICONDUCTOR DEVICE DURING EACH PRODUCTION PROCESS

This application is a continuation, of application Ser. No. 07/773,276, filed Oct. 9, 1991, now abandoned.

BACKGROUND OF THE INVENTION

1. Field of the Invention

The present invention relates to a stress-detection semiconductor device, more particularly, to a stress-detection semiconductor device having a stress detection circuit for detecting electrostatic stress applied to a product semiconductor device during each production process.

2. Description of the Related Art

Due to the progress made in the miniaturization of semiconductor devices and semiconductor elements, such a semiconductor device is now formed as a large scale integration device, and accordingly a PN-junction of the semiconductor element and a gate insulation film of a metal insulation silicon (MIS) transistor are easily destroyed by electric or mechanical stress imposed during the production processes thereof. For example, electrostatic stress (i.e., electro-static discharge: ESD) is applied to the semiconductor device (product semiconductor device) while the semiconductor device is produced, tested, transferred, and therefore, the product semiconductor device sometimes must be scrapped.

Usually, the semiconductor device is checked by carrying out a DC test and a functional test, and these DC and functional tests are carried out in both the wafer state and packaged state of the semiconductor device. Note, the DC test, for example, is carried out by measuring a short-circuit between a power supply terminal and the ground and a leak current among input and output terminals, and the functional test is carried out by measuring various functions when the semiconductor device is in an operational state.

Therefore, the results of the DC test and functional test show that a portion of the semiconductor device is defective, it can be determined whether the defective portion of the semiconductor appeared during the wafer state (i.e., wafer process) or the packaged state (i.e., packaging or assembling process).

Nevertheless, the cause of the appearance of the defective portion of the semiconductor device can not be determined, and in which process the defective portion of the semiconductor device appeared cannot be concretely determined. Namely, in the prior art, for example, when the semiconductor device is destroyed by electrostatic stress, it cannot be determined when or where the electrostatic stress was applied to the semiconductor device.

Consequently, considerable time is required to determine an inferior portion of the design of the semiconductor device and of the manufacturing devices used for carrying out the various production processes of the semiconductor device (i.e., product semiconductor device). Further, this makes it difficult to improve the design of and the device used for manufacturing the product semiconductor device.

SUMMARY OF THE INVENTION

An object of the present invention is to provide a stress-detection semiconductor device for detecting electrostatic stress applied to a product semiconductor device during each production process, to specify an inferior portion of the design and of the device used for manufacturing the product semiconductor device, in a short time, and to easily improve (or feedback) the design and the device used for manufacturing the product semiconductor device.

According to the present invention, there is provided a stress-detection semiconductor device having a stress detection circuit for detecting stress applied to a product semiconductor device, wherein the stress detection circuit comprises a plurality of stress detection units each including a resistor and a stress registering element connected to the resistor, a resistance value of the resistor being specified as a different value by each of the plurality of stress detection units. Each of the stress detection units further comprises a plurality of pads connected to the resistor or the stress registering element, and the applied stress is detected by measuring the characteristics of the stress registering element among the pads.

The stress detection element may be formed by a transistor, and the stress applied to the product semiconductor device during a specific production process may be detected by measuring and comparing the characteristics of the transistor before and after each of the specific production processes. The stress detection element may be formed by a transistor including a PN-junction, and the stress applied to the product semiconductor device during the specific production process may be detected by the destruction of the PN-junction, and further, the stress registering element may be formed by a MIS transistor including a gate insulation film, and the stress applied to the product semiconductor device during the specific production process may be detected by a deterioration and destruction of the gate insulation film.

The stress applied to the product semiconductor device during the specific production process may be detected by the deterioration of the gate insulation film by measuring subthreshold characteristics of the MIS transistor. The stress registering element may be formed by a diode, and the stress applied to the product semiconductor device during a specific production process may be detected by measuring and comparing the characteristics of the diode before and after each of the specific production processes. The stress registering element may be formed by a diode including a PN-junction, and the stress applied to the product semiconductor device during the specific production process may be detected by the destruction of the PN-junction.

The resistor may be formed by a resistance area made of polycrystal silicon or tungsten siliside. The resistance value of the resistor may be determined by changing a width of the resistance area, and further, the resistance value of the resistor may be determined by changing a length of the resistance area.

The stress detection circuit may be formed on an exclusive chip for the stress-detection semiconductor device, and a semiconductor wafer may comprise the exclusive chip and a plurality of real chips each including a required semiconductor circuit for the product semiconductor device. The stress detection circuit may be formed at a stress detection area, and a semiconductor wafer may comprise a plurality of real chips each including the stress detection area and a required semiconductor circuit for the product semiconductor device.

Further, according to the present invention, there is provided a method of producing a stress-detection semiconductor device four detecting stress applied to a product semiconductor device, wherein the method comprises the steps of: forming a stress detection circuit on the stress-detection semiconductor device by a wafer process; sending the stress-detection semiconductor device having the stress detection circuit through a plurality of production processes accompanied by a plurality of product semiconductor devices; and detecting the stress applied to the product semiconductor devices during each of the production processes by measuring and comparing the characteristics of a stress registering element included in the stress detection circuit before and after each of the production processes.

The measurement of the characteristics of the stress registering element may be carried out before and after each production process, from a wafer state to a packaged state, until the product semiconductor device is ready for shipping.

BRIEF DESCRIPTION OF THE DRAWINGS

The present invention will be more clearly understood from the description of the preferred embodiments as set forth below with reference to the accompanying drawings, wherein.

DESCRIPTION OF THE PREFERRED EMBODIMENTS

The preferred embodiments according to the present invention will be explained with reference to accompanying drawings.

Figure 1A:
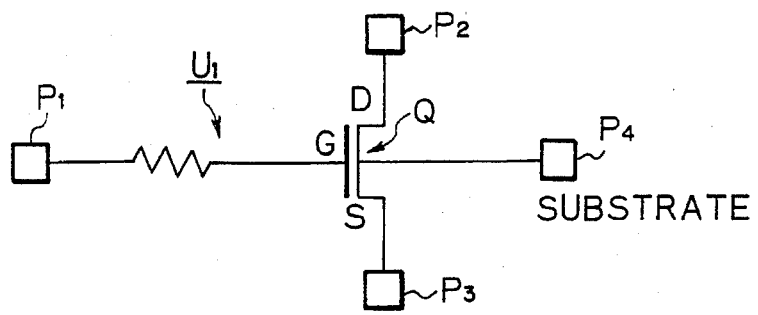
FIGS. 1A to 1C are diagrams indicating an example of a stress detection unit applied to a stress-detection semiconductor device according to the present invention.
Figure 1B:
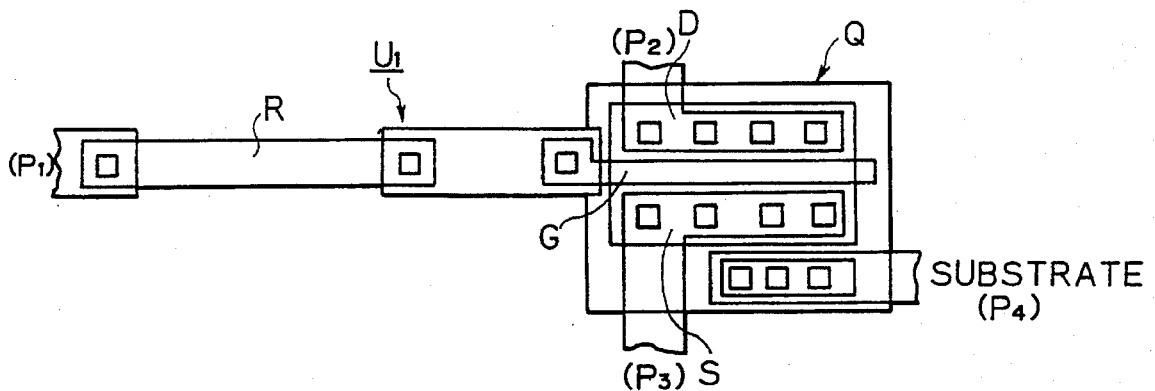
Figure 1C:
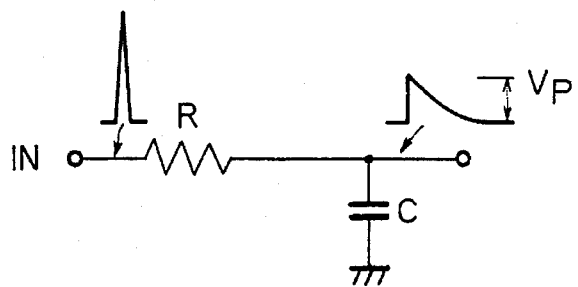

FIGS. 1A to 1C are diagrams indicating an example of a stress detection unit applied to a stress-detection semiconductor device according to the present invention. In FIGS. 1A to 1C, a reference $U_1$ denotes a stress detection unit, Q denotes a MIS transistor as a stress registering element, R denotes a resistor, and $P_1$ to $P_4$ denote pads.

FIG. 1A indicates a basic circuit of the stress detection unit $U_1$, and FIG. 1B indicates a layout pattern of the stress detection unit $U_1$ shown in FIG. 1A. As shown in FIGS. 1A and 1B, the stress detection unit $U_1$ comprises the MIS transistor Q and the resistor R, a gate of the transistor Q is connected to the pad $P_1$ through the resistor R, and a drain and a source of the transistor Q are directly connected to the pads $P_2$ and $P_3$. Note, a back gate of the transistor Q is connected to a substrate ($P_4$).

Note, the stress-detection semiconductor device according to the present invention has a stress detection circuit ($SDC_1$) comprising a plurality of stress detection units $U_1$, and a resistance value of the resistor R is specified as a different value by each of the stress detection units $U_1$. Further, stress (or electrostatic stress) having been applied to a product semiconductor device is detected by the stress detection circuit by measuring and comparing the characteristics of each of the MIS transistors Q of the stress detection units $U_1$ before and after each production process, from a wafer state to a packaged state until the product semiconductor device is ready for shipping, as explained later in more detail.

FIG. 1C indicates an equivalent circuit of a gate input circuit of the MIS transistors Q of the stress detection unit $U_1$, wherein a reference C denotes a capacitor of the gate of the transistor Q. The capacitor C is determined by a gate area, a thickness of a gate insulation film (or gate oxide film), and a material of the gate insulation film of the transistor Q.

As shown in FIG. 1C, when electrostatic stress (electrostatic discharge: ESD) is applied from the outside to the pad $P_1$ (having a size of 150 μm□), the applied electrostatic stress is integrated by the resistor R and the capacitor C and applied to the gate of the transistor Q. Note, the stress (voltage of the electrostatic stress) $V_p$ applied to the gate of the transistor Q becomes low and a breakdown voltage of the insulation film of the transistor Q becomes high, in accordance with an increase of a resistance value of the resistor R connected between the gate of the transistor Q and the pad $P_1$.

For example, when electrostatic stress is applied to the pad $P_1$ and the gate insulation film of the transistor Q is broken, a short-circuit between the pad $P_1$ and $P_3$ occurs, and further, short-circuits between the pad $P_1$ and $P_2$, the pad $P_2$ and $P_3$, and the pad $P_1$ and $P_4$ also may occur. Note, these short-circuits occur in some stress detection units each including a resistor R having a resistance value which is lower than a specific value, to apply electrostatic stress larger than a breakdown voltage of the transistor Q, to the gate of the transistor Q.

As described above, the electrostatic stress from the outside is applied not only to the pad $P_1$ but also to the pads $P_2$, $P_3$, $P_4$ and connection lines. Therefore, when the MIS transistor Q is damaged or destroyed by the electrostatic stress, insulations between the gate and source of the transistor Q (or between the pads $P_1$ and $P_3$), the gate and drain (or the pads $P_1$ and $P_2$), the drain and source (or the pads $P_2$ and $P_3$), and the gate and backgate (or the pads $P_1$ and $P_4$: substrate) may become defective or be broken, and thus leak currents may be increased. Note, the stress registering element is not only a MIS transistor Q including a gate insulation film, and can be a bipolar transistor or a diode (DD) including a PN-junction.

Note, in the stress-detection semiconductor device according to the present invention, the applied electrostatic stress, which is considered to be also applied to the product semiconductor device, is detected by measuring a current among the pads $P_1$, $P_2$, $P_3$, $P_4$. Further, in the stress-detection semiconductor device according to the present invention, when the applied electrostatic stress is not large enough to destroy the gate insulation film of the MIS transistor Q, but the characteristics of the transistor Q can be changed thereby, the applied electrostatic stress can be detected by measuring a change of the characteristics of the transistor Q.

Figure 2:
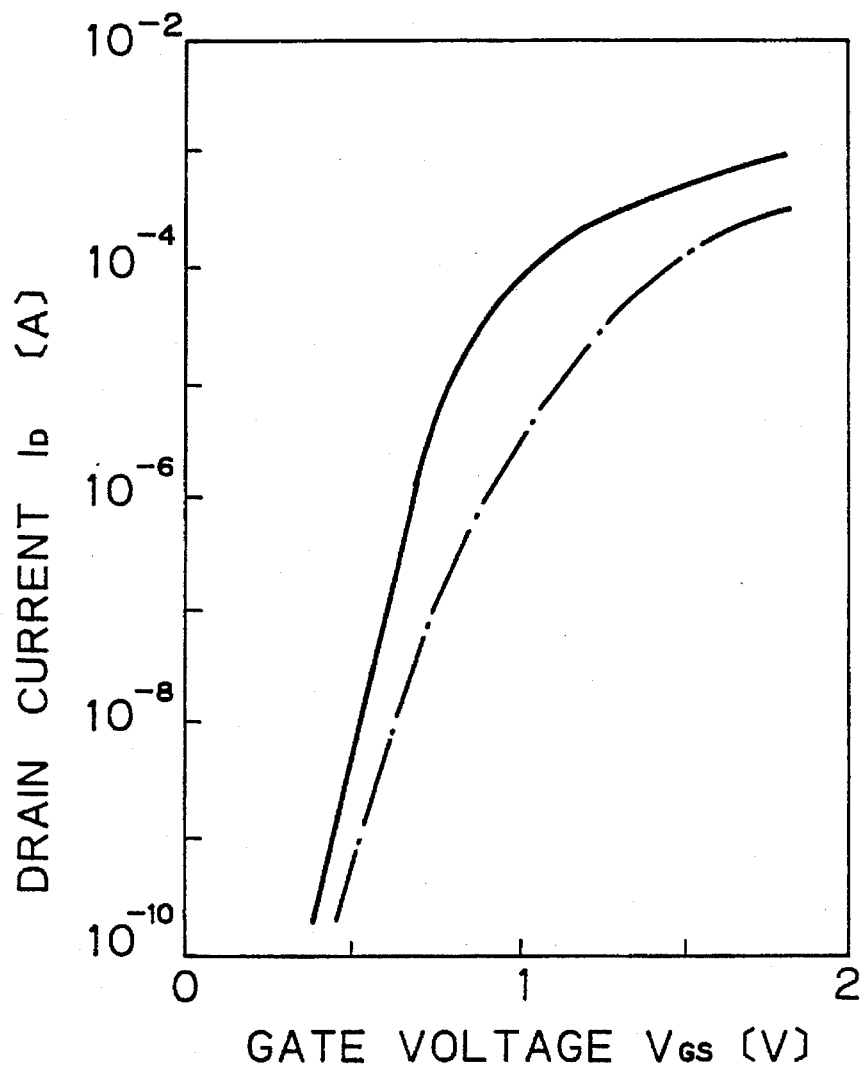
FIG. 2 is a diagram indicating subthreshold characteristics before and after applying electrostatic stress to the stress detection unit shown in FIG. 1.

FIG. 2 is a diagram indicating subthreshold characteristics before and after applying electrostatic stress to the stress detection unit $U_1$ shown in FIG. 1. Note, the subthreshold characteristics shown in FIG. 2 are those occurring when the MIS transistor Q is an N-channel type MIS transistor and the carriers trapped in the gate insulation film of the MIS transistor Q are electrons.

As shown in FIG. 2, after applying electrostatic stress to the stress detection unit $U_1$, the subthreshold characteristics are shifted to the right in the drawing. Namely, after applying electrostatic stress to the stress detection unit $U_1$, obtain a flow of a drain current $I_D$ having the same value as that before the electrostatic stress was applied, a higher gate voltage $V_{GS}$ must be applied to the gate of the transistor Q.

As described above, when the applied electrostatic stress is not large enough to destroy the gate insulation film of the MIS transistor Q, but the subthreshold characteristics of the transistor Q can be changed thereby, the applied electrostatic stress can be detected by measuring a change of the subthreshold characteristics of the transistor Q.

In the prior art, a hot carrier injection phenomenon is known whereby hot state carriers (electrons and holes) are trapped in a gate insulation film of a MIS transistor. Note, the hot state carriers are, for example, caused by an application of electrostatic stress having a voltage not high enough to destroy the insulation of the gate insulation film of the transistor, but high enough to change the subthreshold characteristics of the transistor. Therefore, the applied electrostatic stress can be detected by measuring the change of the subthreshold characteristics, wherein the change is caused by the hot carrier injection phenomenon of the MIS transistor.

Note, as described above, FIG. 2 indicates the subthreshold characteristics when the MIS transistor is an N-channel type MIS transistor and carriers trapped in the gate insulation film are electrons. Nevertheless, the changes of the subthreshold characteristics occur not only in the above case, and can be also occur when the MIS transistor is a P-channel type MIS transistor and carriers trapped in the gate insulation film are electrons or holes. For example, when the MIS transistor is an N-channel type MIS transistor and carriers trapped in the gate insulation film are holes, the subthreshold characteristics are shifted to the left in the drawing.

Figure 3:
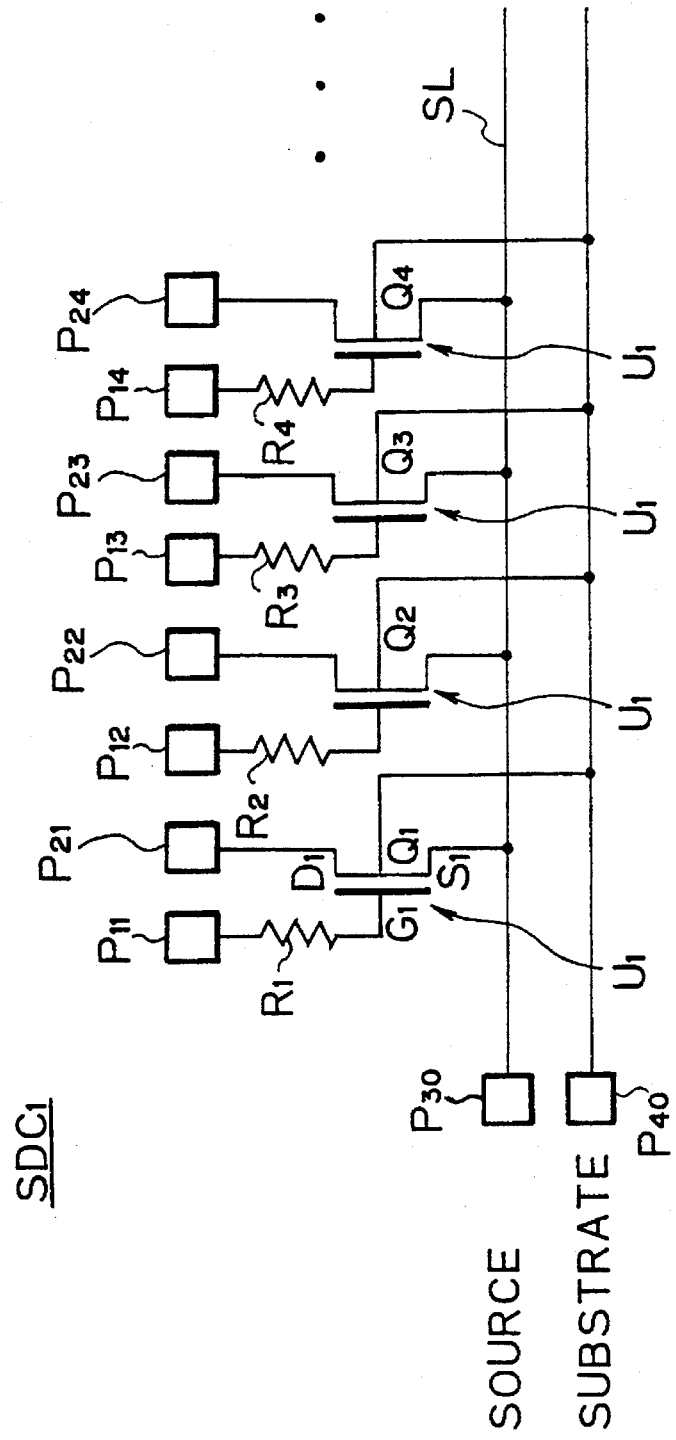
FIG. 3 is a circuit diagram indicating an embodiment of a stress detection circuit provided in a stress-detection semiconductor device according to the present invention.

FIG. 3 is a circuit diagram indicating an embodiment of a stress detection circuit provided in a stress-detection semiconductor device according to the present invention.

As shown in FIG. 3, a stress detection circuit $SDC_1$ comprises a plurality of stress detection units $U_1$ shown in FIGS. 1A to 1C. Namely, the stress detection circuit $SDC_1$ comprises a plurality of resistors $R_1$, $R_2$, $R_3$, $R_4$, ..., MIS transistors $Q_1$, $Q_2$, $Q_3$, $Q_4$, ..., and pads $P_{11}$, $P_{12}$, $P_{13}$, $P_{14}$, ..., $P_{21}$, $P_{22}$, $P_{23}$, $P_{24}$, ..., $P_{30}$, $P_{40}$. In the stress detection circuit $SDC_1$, each of the transistors $Q_1$, $Q_2$, $Q_3$, $Q_4$, ... has the same size, and gates of the transistors $Q_1$, $Q_2$, $Q_3$, $Q_4$, ... are connected to the pads $P_{11}$, $P_{12}$, $P_{13}$, $P_{14}$, ... through the resistors $R_1$, $R_2$, $R_3$, $R_4$, ..., respectively. Note, the sources of the transistors $Q_1$, $Q_2$, $Q_3$, $Q_4$, ... are commonly connected to the pad $P_{30}$ through a source connection line SL, and the drains thereof are connected to the pads $P_{21}$, $P_{22}$, $P_{23}$, $P_{24}$, .... Also, the back gates thereof are commonly connected to the pad $P_{40}$ (substrate) through the connection line. Further, the number of stress detection units $U_1$ constituting the stress detection circuit $SDC_1$ is, for example, more than ten, and resistance values of the resistors $R_1$, $R_2$, $R_3$, $R_4$, ... are, for example, 0 Ω~1 kΩ, 1 Ω~10 kΩ, or 0 Ω~10 MΩ, in accordance with the conditions applying to the product semiconductor device and the stress-detection semiconductor device.

Figure 4:
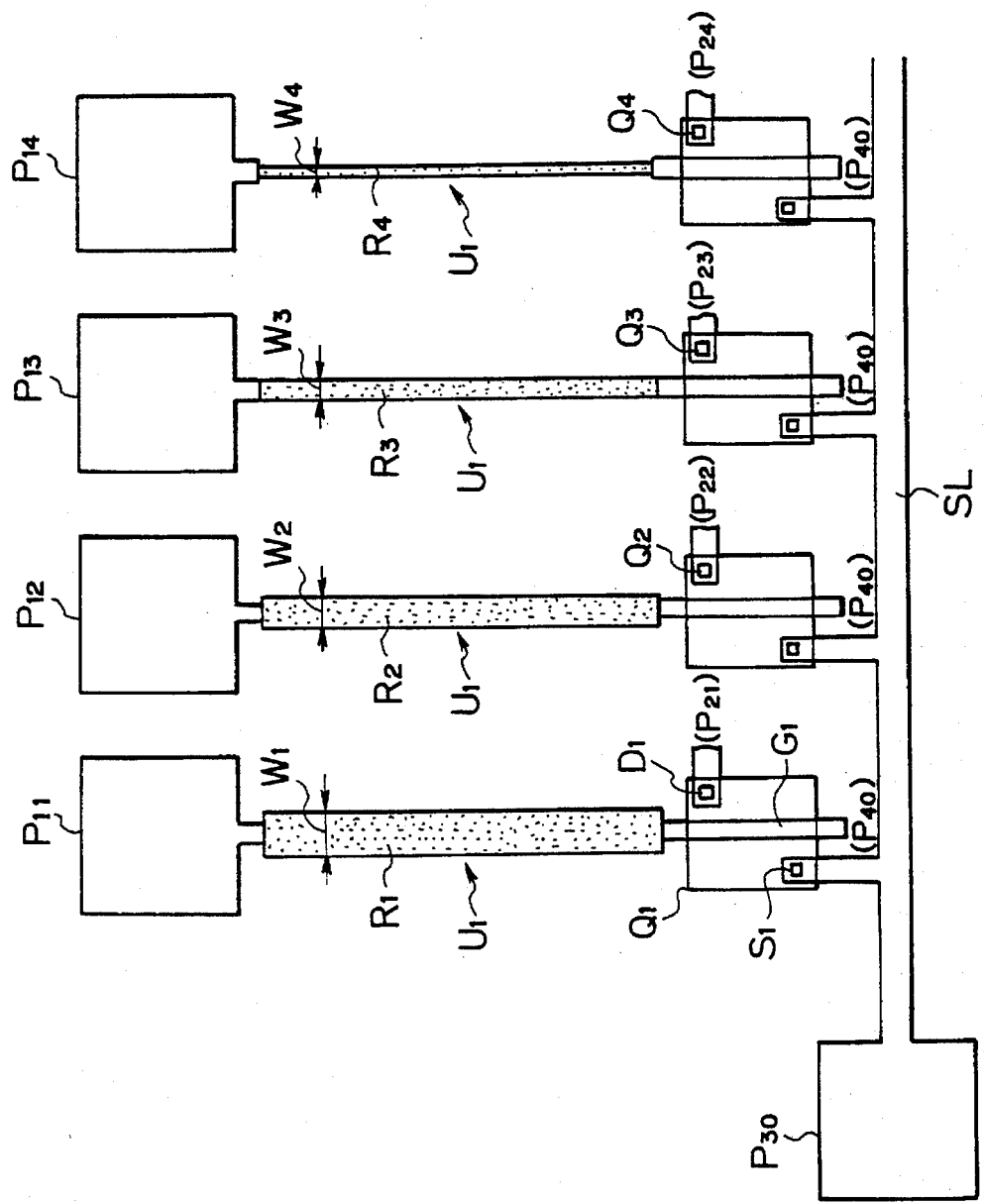
FIG. 4 is a diagram indicating an example of a layout pattern of the stress detection circuit shown in FIG. 3.

FIG. 4 is a diagram indicating an example of a layout pattern of the stress detection circuit shown in FIG. 3. As shown in FIG. 4, the resistance values of the resistors $R_1$, $R_2$, $R_3$, $R_4$, ... of the stress detection circuit $SDC_1$ are determined by changing the widths $W_1$, $W_2$, $W_3$, $W_4$, ... of the resistance areas ($R_1$, $R_2$, $R_3$, $R_4$, ...), which are made of polycrystal silicon, tungsten siliside (WSi) and the like.

Namely, in an example of a configuration of the stress detection circuit $SDC_1$, the resistance value of the resistor $R_1$ is 1 kΩ, the resistance value of the resistor $R_2$ is 2 kΩ, the resistance value of the resistor $R_3$ is 3 kΩ, and the resistance value of the resistor $R_4$ is 4 kΩ, ..., i.e., in the range of from 1 kΩ to 10 kΩ. Further, in another example of the configuration of the stress detection circuit $SDC_1$, the resistance value of the resistor $R_1$ is 0 Ω, the resistance value of the resistor $R_2$ is 100 Ω, the resistance value of the resistor $R_3$ is 200 Ω, and the resistance value of the resistor $R_4$ is 300 Ω, ..., i.e., in the range of from 0 Ω to 1 kΩ. Furthermore, the number of the resistors (or transistors) is, for example, more than ten. Also, the pads $P_{30}$, $P_{11}$, $P_{12}$, $P_{13}$, $P_{14}$, ... ($P_{40}$ $P_{21}$, $P_{22}$, $P_{23}$, $P_{24}$, ...) and the connection lines (SL) are made of metal such as aluminium, but these pads and the connection lines also can be made of polycrystal silicon, for constituting resistors.

Note, in the stress detection circuit $SDC_1$, if one of the pads $P_{30}$, $P_{11}$, $P_{12}$, $P_{13}$, $P_{14}$, ... ($P_{40}$ $P_{21}$, $P_{22}$, $P_{23}$, $P_{14}$, ...), the connection lines, and the like, and the gate insulation films of some of the transistors are broken (or destroyed), short-circuits among the pads occur and the applied electrostatic stress is detected by measuring the currents among the pads. For example, when the electrostatic stress is applied to the stress detection circuit $SDC_1$ (or the stress-detection semiconductor device and the product semiconductor devices), and only two MIS transistors $Q_1$ and $Q_2$ are destroyed or changed and the other transistors $Q_3$, $Q_4$, ... are not changed, the value of the applied electrostatic stress can be determined. Furthermore, the stress applied to the stress detection circuit $SDC_1$ can be detected by measuring and comparing the characteristics of each of the MIS transistors before and after each of the production processes.

Figure 5:
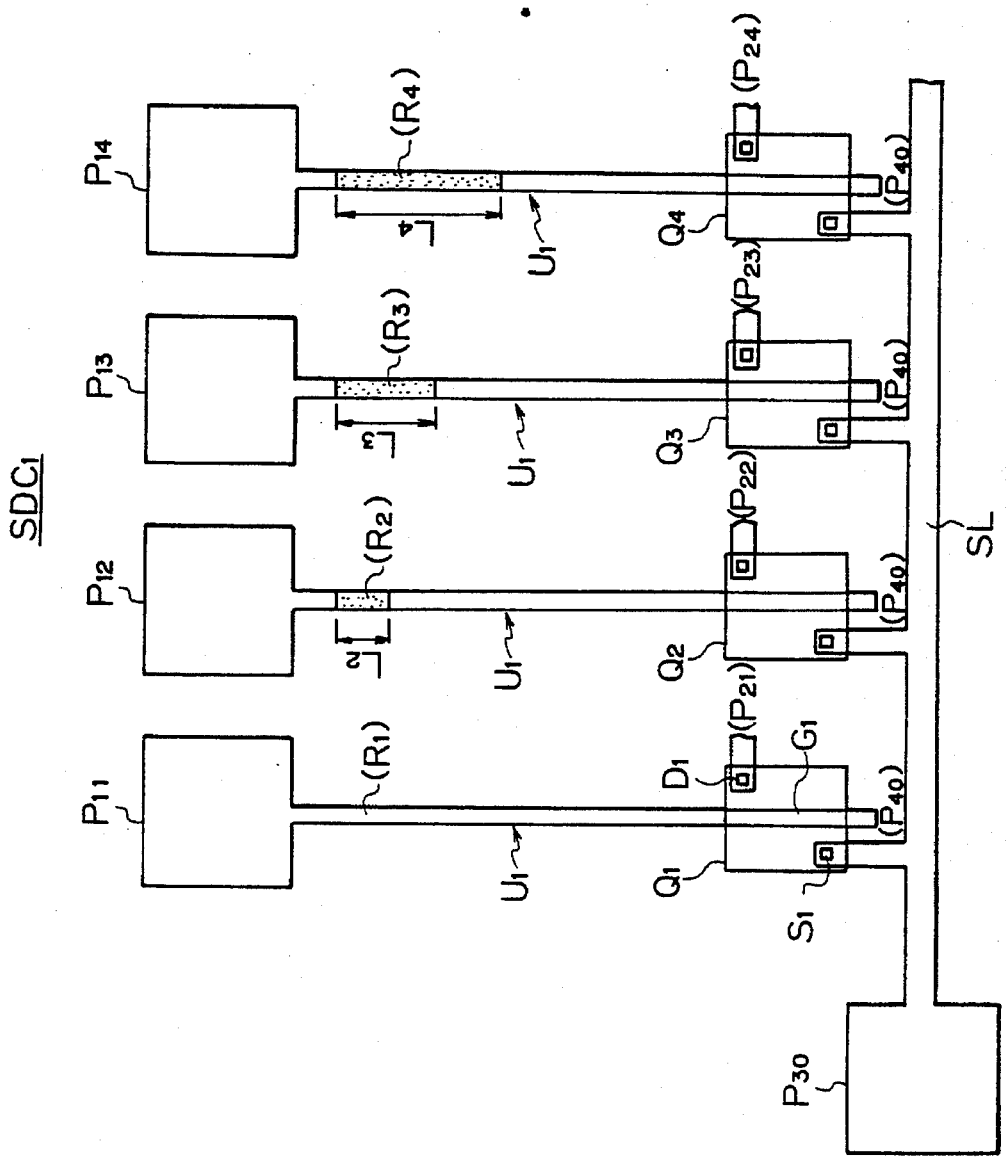
FIG. 5 is a diagram indicating another example of a layout pattern of the stress detection circuit shown in FIG. 3.

FIG. 5 is a diagram indicating another example of a layout pattern of the stress detection circuit shown in FIG. 3. As shown in FIG. 5, the resistance values of the resistors $R_1$, $R_2$, $R_3$, $R_4$, ... of the stress detection circuit $SDC_1$ are determined by changing the lengths $L_2$, $L_3$, $L_4$, ... of the resistance areas ($R_2$, $R_3$, $R_4$, ...), which are made of polycrystal silicon, tungsten siliside (WSi) and the like. Note, in the stress detection circuit $SDC_1$ shown in FIG. 5, a gate of the transistor $Q_1$ is connected to the pad $P_{11}$ through aluminium wiring, i.e., the resistance area is not provided, and thus the resistance value of the resistor ($R_1$) is about 0 Ω.

Figure 6:
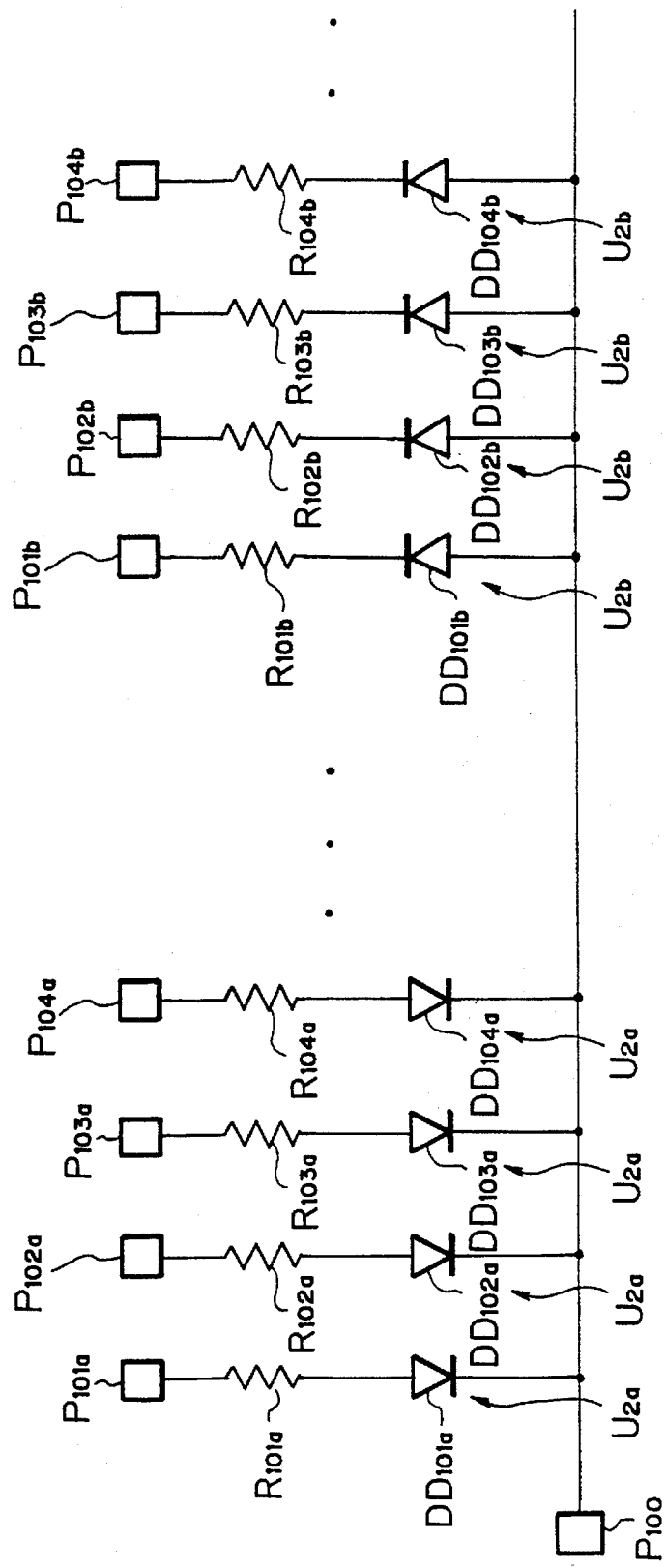
FIG. 6 is a circuit diagram indicating another embodiment of a stress detection circuit provided in a stress-detection semiconductor device according to the present invention.

FIG. 6 is a circuit diagram indicating another embodiment of a stress detection circuit $SDC_2$ provided in a stress-detection semiconductor device according to the present invention. As shown in FIG. 6, a stress detection circuit $SDC_2$ comprises a plurality of stress detection units $U_{2a}$, $U_{2b}$. Namely, the stress detection circuit $SDC_2$ comprises a plurality of resistors $R_{101a}$, $R_{102a}$, $R_{103a}$, $R_{104a}$, ..., $R_{101b}$, $R_{102b}$, $R_{103b}$, $R_{104b}$, ..., diodes $DD_{101a}$, $DD_{102a}$, $DD_{103a}$, $DD_{104a}$, ..., $DD_{101b}$, $DD_{102b}$, $DD_{103b}$, $DD_{104b}$, ... each including a PN-junction, and pads $P_{101a}$, $P_{102a}$, $P_{103a}$, $P_{104a}$, ..., $P_{101b}$, $P_{102b}$, $P_{103b}$, $P_{104b}$, ..., $P_{100}$.

In the stress detection circuit $SDC_2$, each of the diodes has the same size, anodes of the diodes $DD_{101a}$, $DD_{102a}$, $DD_{103a}$, $DD_{104a}$, ... are connected to the pads $P_{101a}$, $P_{102a}$, $P_{103a}$, $P_{104a}$, ... through the resistors $R_{101a}$, $R_{102a}$, $R_{103a}$, $R_{104a}$, ..., cathodes of the diodes $DD_{101b}$, $DD_{102b}$, $DD_{103b}$, $DD_{104b}$, ... are connected to the pads $P_{101b}$, $P_{102b}$, $P_{103b}$, $P_{104b}$, ... through the resistors $R_{101b}$, $R_{102b}$, $R_{103b}$, $R_{104b}$, ..., and cathodes of the diodes $DD_{101a}$, $DD_{102a}$, $DD_{103a}$, $DD_{104a}$, ... and anodes of the diodes $DD_{101b}$, $DD_{102b}$, $DD_{103b}$, $DD_{104b}$, ... are commonly connected to the pad $P_{100}$. Note, the number of stress detection units $U_{2a}$, $U_{2b}$ constituting the stress detection circuit $SDC_2$ is, for example, specified over ten, respectively. Further, the stress applied to the stress detection circuit $SDC_2$ (or the stress-detection semiconductor device and the product semiconductor devices) can be detected by the destruction of the PN-junction of each of the diodes. Furthermore, the diodes $DD_{101a}$, $DD_{102a}$, $DD_{103a}$, $DD_{104a}$, ... of the stress detection units $U_{2a}$ and the diodes $DD_{101b}$, $DD_{102b}$, $DD_{103b}$, $DD_{104b}$, ... of the stress detection units $U_{2b}$ are inversely connected between the pads $P_{101a}$, $P_{102a}$, $P_{103a}$, $P_{104a}$, ..., $P_{101b}$, $P_{102b}$, $P_{103b}$, $P_{104b}$, ... and the pad $P_{100}$. Therefore, in the stress detection circuit $SDC_2$, the polarity of the electrostatic stress applied to the stress detection circuit $SDC_2$ also can be detected by two groups of the stress detection units $U_{2a}$ and $U_{2b}$. Also, as described above, the resistance values of the resistors $R_{101a}$, $R_{102a}$, $R_{103a}$, $R_{104a}$, ..., $R_{101b}$, $R_{102b}$, $R_{103b}$, $R_{104b}$, ... are, for example, 0 $\Omega$~1 k$\Omega$, 1 k$\Omega$~10 k$\Omega$, or 0 $\Omega$~10 M$\Omega$, in accordance with the conditions applying to the product semiconductor device and the stress-detection semiconductor device.

Figure 7:
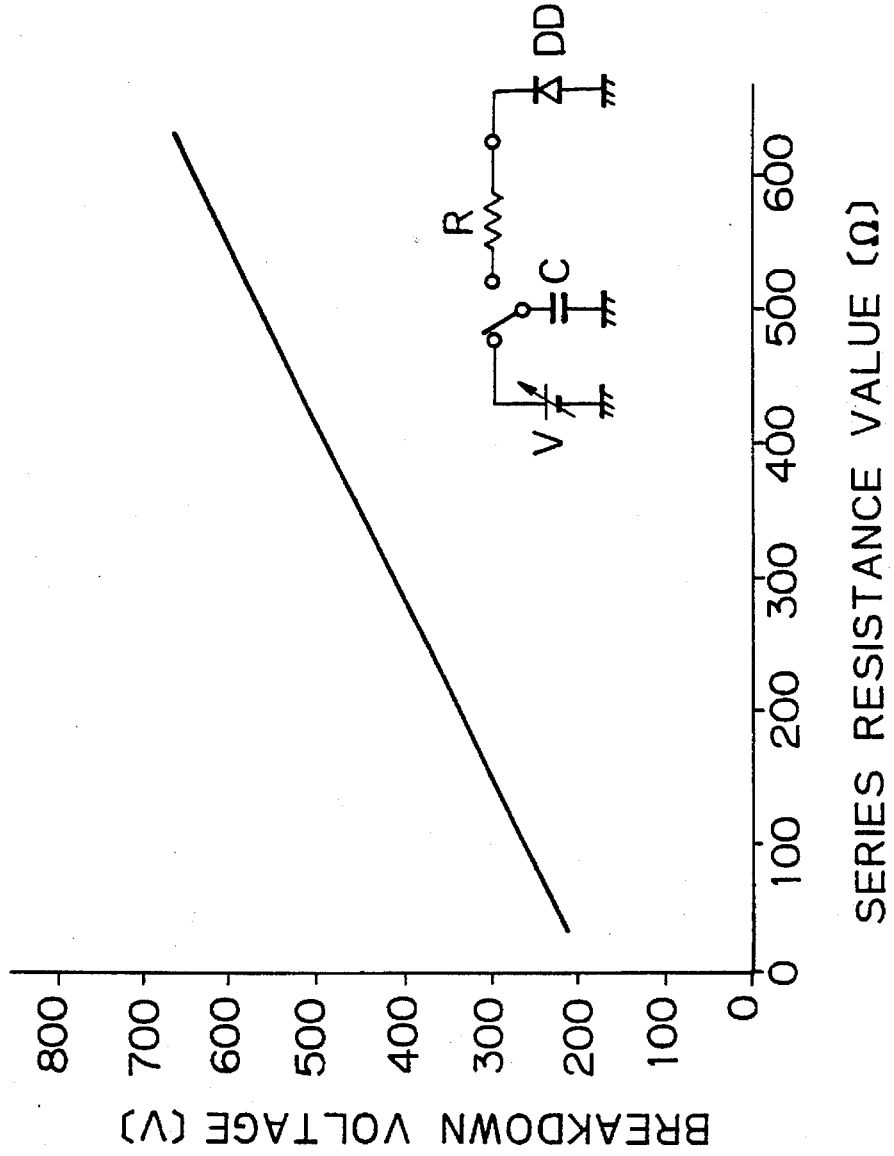
FIG. 7 is a diagram indicating a relationship between a breakdown voltage and a series resistance value used for the stress detection circuit shown in FIG. 6.

FIG. 7 indicates a relationship between a breakdown voltage and a series resistance value used for the stress detection circuit shown in FIG. 6.

As clearly shown in FIG. 7, the relationship between a breakdown voltage of a PN-junction of a diode DD and a resistance value of a resistor R (or series resistance value) connected in series to the diode DD is such that the breakdown voltage is proportional to the series resistance value. Namely, when electrostatic stress is applied to the stress detection circuit $SDC_2$ (or stress detection units $U_{2a}$, $U_{2b}$), the voltage of the applied electrostatic stress is divided and the voltage applied to the diode DD is lowered in accordance with the series resistance value, whereby the breakdown voltage is increased in accordance with the series resistance value. Note, the relationship between the breakdown voltage of the PN-junction of the diode DD is also effected when the connection direction (or polarity) of the diode DD is inverted, and further, the relationship can be effected when the diode DD is replaced by a transistor having a PN-junction.

As described above, according to the stress-detection semiconductor including the stress detection circuit of the present invention, an inferior portion of the design and devices for manufacturing the product semiconductor device can be specified in a short time, and thus the design and device for manufacturing the product semiconductor device can be easily improved.

Figure 8A:
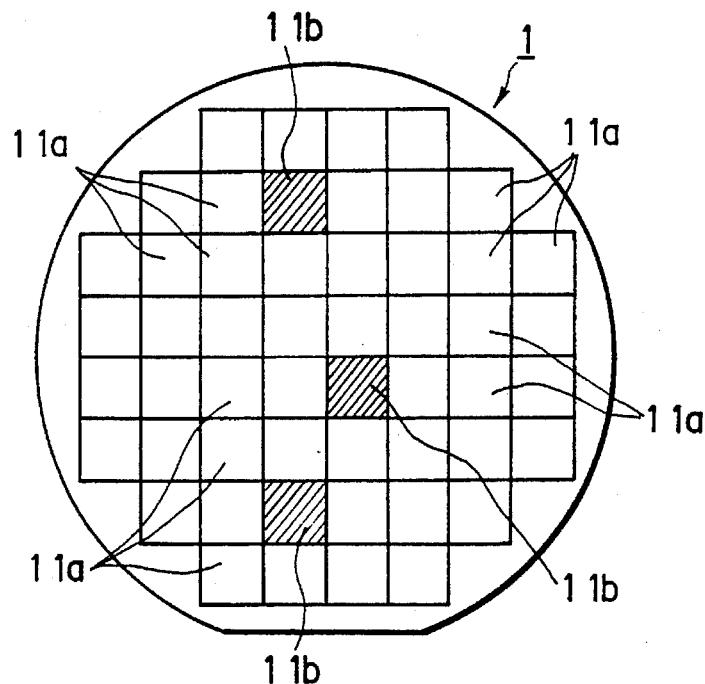
FIGS. 8A and 8B are diagrams indicating two kinds of wafer configurations, for explaining a stress-detection semiconductor device according to the present invention.
Figure 8B:
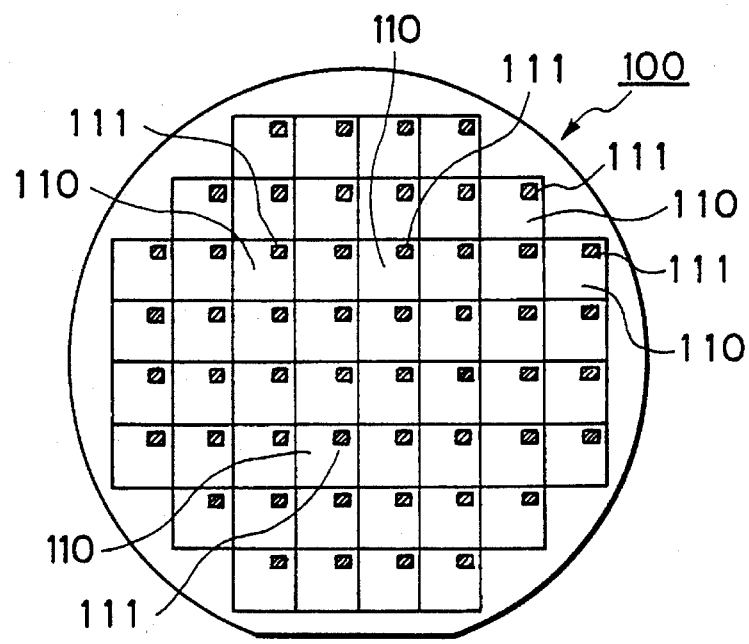

FIGS. 8A and 8B shows two kinds of wafer configurations, for explaining a stress-detection semiconductor device according to the present invention. In FIGS. 8A and 8B, reference numerals 1 and 100 denote wafers, 11a and 110 denote real chips used for product semiconductor devices, 11b denotes an exclusive chip used for a stress-detection semiconductor device, and 111 denotes a stress detection area provided in the real chip 110.

As shown in FIG. 8A, the wafer 1 comprises a plurality of real chips 11a and some exclusive chips 11b. The real chip 11a, which is a product semiconductor device, comprises a required semiconductor circuit, and the exclusive chip 11b comprises a stress detection circuit ($SDC_1$, $SDC_2$). Note, the exclusive chip 11b, which is a stress-detection semiconductor device, is used only to detect the electrostatic stress applied to the wafer 1 or the chips 11a, 11b and is not marketed as a product semiconductor device. Further, the exclusive chip 11b is arranged on portions of the wafer 1, to detect electrostatic stress applied to the wafer 1.

As shown in FIG. 8B, the wafer 100 comprises a plurality of real chips 110, which is a product semiconductor device or a stress-detection semiconductor device, and which comprises a required semiconductor circuit and a stress detection circuit ($SDC_1$, $SDC_2$). Namely, the stress detection circuit is formed at a stress detection area 111 included in the real chip 110. Note, the real chip 110 is used as a product semiconductor device when using (or wiring) the required semiconductor circuit, and the real chip 110 is used for a stress-detection when using the stress detection circuit.

In the above description, the required semiconductor circuit is, for example, a memory circuit, a logic circuit, or other kind of semiconductor circuits, and thus the product semiconductor device is also one of many kind of semiconductor device.

Figure 9A:
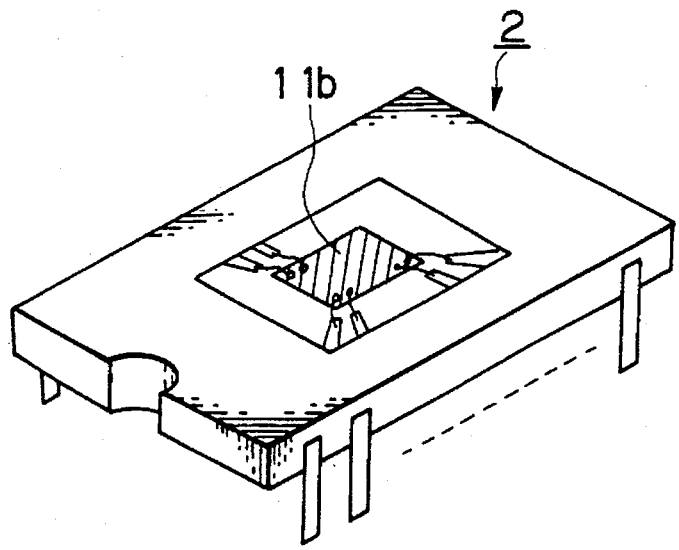
FIGS. 9A and 9B are diagrams indicating two kinds of packaged stress-detection semiconductor devices using two kinds of chips shown in FIGS. 8A and 8B.
Figure 9B:
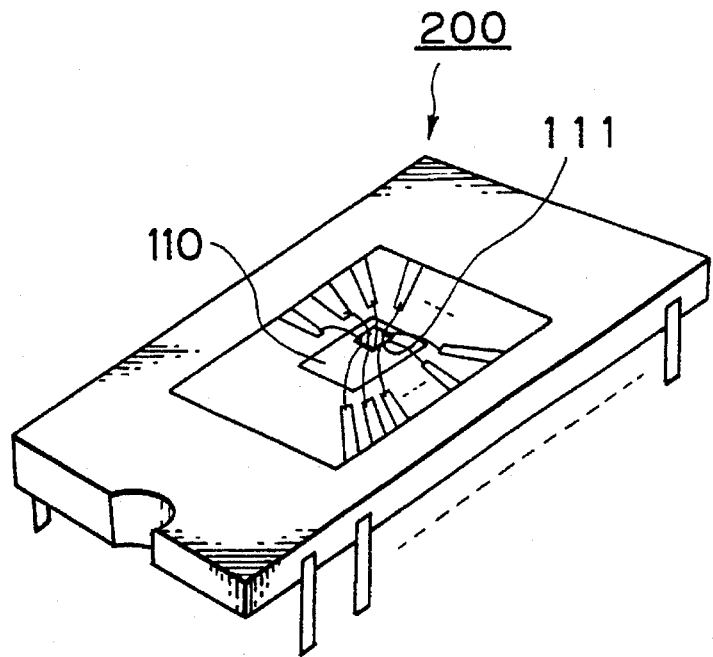

FIGS. 9A and 9B are diagrams indicating two kinds of packaged stress-detection semiconductor devices using two kinds of chips shown in FIGS. 8A and 8B. Namely, FIG. 9A indicates a packaged (or assembled) stress-detection semiconductor device 2 comprising the exclusive chip 11b shown in FIG. 8A, and FIG. 9B indicates a packaged stress-detection semiconductor device 200 comprising the real chip 110 shown in FIG. 8B, when wiring to the stress detection circuit at the stress detection area 111. Note, the packaged stress-detection semiconductor device 200 can be used as a product semiconductor device by changing the connections (wirings) from the stress detection circuit 111 to the required semiconductor circuit by special methods (not included in the present invention).

Figure 10:
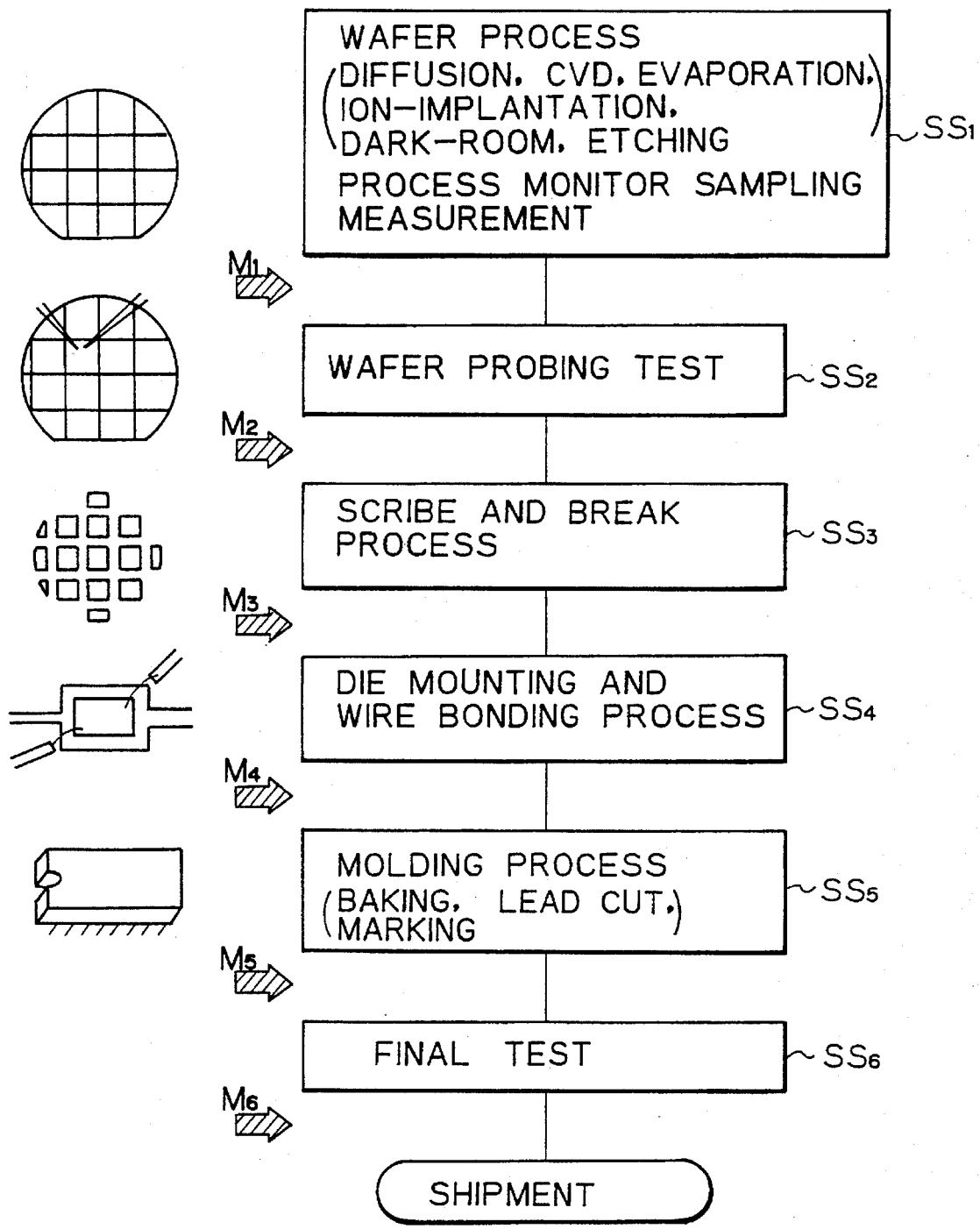
FIG. 10 is a flow chart indicating the production processes of a product semiconductor device, for explaining a stress measurement made by using a stress-detection semiconductor device according to the present invention.

FIG. 10 is a flow chart of the production processes of a product semiconductor device, for explaining a stress measurement made by using a stress-detection semiconductor device according to the present invention.

As shown in FIG. 10, first, in step $SS_1$, a wafer process is carried out and the required semiconductor circuit and the stress detection circuit ($SDC_1$, $SDC_2$) are formed on the wafer (wafer 1, 100 shown in FIG. 8A and 8B), and then a process monitor sampling measurement is carried out. Note, the wafer process includes a diffusion process, a chemical vapor deposition (CVD) process, an evaporation process, an ion-implantation process, a dark-room process, an etching process, and the like. Further, after this wafer process, the stress detection circuit (the required semiconductor circuit) formed on the wafer can function, and thus the electrostatic stress applied to the wafer can be detected. Therefore, after step $SS_1$ carrying out the wafer process and the process monitor sampling measurement, the electrostatic stress applied to the wafer is measured by the stress detection circuit (stress measurement step $M_1$). Note, the stress measurement step $M_1$ is carried out by connecting probes to the pads of the stress detection unit of the stress detection circuit.

Next, in step $SS_2$, a wafer probing test is carried out, and after step $SS_2$, the electrostatic stress is measured by the stress detection circuit (stress measurement step $M_2$). Therefore, the electrostatic stress applied to the wafer during the wafer probing test of step $SS_2$ can be detected by comparing the characteristics of the stress detection circuit (or MIS transistor Q, or diode DD) from the results of the stress measurement step $M_1$ and of the stress measurement step $M_2$.

Further, at step $SS_3$, a scribe and brake process is carried out, and the chips (11a, 11b, 110) are divided. Similarly, after step $SS_3$, the electrostatic stress is measured by the stress detection circuit (stress measurement step $M_3$), and the electrostatic stress applied to the wafer or divided chips during the scribe and brake process of step $SS_3$ can be detected by comparing the characteristics of the stress detection circuit from the results of the stress measurement step $M_2$ and the stress measurement step $M_3$.

Furthermore, at step $SS_4$, a die mounting and wire bonding process is carried out, and the electrostatic stress is measured by the stress detection circuit (stress measurement step $M_4$). Next, at step $SS_5$, a molding process is carried out, and the electrostatic stress is measured by the stress detection circuit (stress measurement step $M_5$). Note, in this molding process, as shown in FIGS. 9A and 9B, the chip 11b, 110 for the stress-detection semiconductor device is packaged or assembled as the product semiconductor device, and the packaged stress-detection semiconductor device is sent through the production processes accompanied by a plurality of product semiconductor devices. Further, at step $SS_6$, a final test is carried out, and the electrostatic stress is measured by the stress detection circuit (stress measurement step $M_6$).

Note, the electrostatic stresses applied to the stress-detection semiconductor device (or product semiconductor devices) during the die mounting and wire bonding process of step $SS_4$, the molding process of step $SS_5$, and the final test of step $SS_6$ can be also detected by comparing the characteristics of the stress detection circuit from the results of the stress measurement steps $M_3$ and $M_4$, $M_4$ and $M_5$, and $M_5$ and $M_6$, respectively. Further, after the final test of step $SS_6$ and the measurement step $M_6$, the product semiconductor devices are ready for shipping.

As described above, the stress-detection semiconductor device having a stress detection circuit is accompanied by a plurality of product semiconductor devices and sent through a plurality of production processes, after the stress detection circuit is formed by the wafer process of step $SS_1$, and the electrostatic stress applied to the product semiconductor devices during each of the production processes is detected by measuring and comparing the characteristics of the stress detection element (which is a transistor or a diode) before and after each of the production processes.

Next, an example of a practical measurement of the electrostatic stress during a specific production process using an automatic handler device (which is one of the device for manufacturing the semiconductor device) will be described.

When a stress-detection semiconductor device having a stress detection circuit $SDC_1$ shown in FIG. 3 was inserted to the automatic handler device, the characteristics of each of the MIS transistors $Q_1$, $Q_2$, $Q_3$, $Q_4$, . . . of the stress detection circuit $SDC_1$ were measured at before and after inserting the stress-detection semiconductor device. Note, the resistors $R_1$, $R_2$, $R_3$, $R_4$, . . . of the stress detection circuit $SDC_1$ had the resistors of which resistance values are 0 $\Omega$~10 M$\Omega$, and the breakdown voltage of each of the transistors $Q_1$, $Q_2$, $Q_3$, $Q_4$, . . . (or stress detection units $U_1$) was previously measured and known.

The results of this case, in the stress detection units $U_1$ including resistors having resistance values lower than 10 k$\Omega$, the characteristics of the MIS transistors were changed, or the gate insulation films of the MIS transistors were broken. Note, the breakdown voltages of the MIS transistors connecting the resistors (resistance values 0 $\Omega$~10 k$\Omega$) corresponded to 100 volts~1000 volts. Namely, when the voltage of the applied electrostatic stress was at 100 volts, the MIS transistor connected to the resistor having a resistance value 0 $\Omega$ was broken. Further, when the voltage of the applied electrostatic stress was 1000 volts, the MIS transistor connected to the resistor having a resistance value 10 k$\Omega$ was damaged, or all of the MIS transistors connected to the resistors having a resistance value lower than 10k$\Omega$ were broken. Therefore, it was considered that electrostatic stress had been applied to the stress-detection semiconductor device (or product semiconductor devices) in the automatic handler device, and that the voltage of the applied electrostatic was 1000 volts.

Consequently, an inferior portion of a manufacturing device wherein an excessive electrostatic stress is applied to the product semiconductor device can be easily determined, and further, an inferior portion of the design of the semiconductor device can be easily improved.

Many widely differing embodiments of the present invention may be constructed without departing from the spirit and scope of the present invention, and it should be understood that the present invention is not limited to the specific embodiments described in this specification, except as defined in the appended claims.

I claim:

1. A stress-detection semiconductor device having a stress detection circuit functionally independent and physically associated with a product semiconductor device, said stress detection circuit comprising a plurality of stress detection units and at least one circuit pad connected to said stress detection units, each of said stress detection units including a resistor, a first detection unit pad connected to said resistor, and a stress registering element connected to said resistor, each said resistor having a different resistance value.

2. A stress-detection semiconductor device as claimed in claim 1, wherein each of said stress detection units further comprises a second detection unit pad connected to said stress registering element.

3. A stress-detection semiconductor device as claimed in claim 1, wherein said stress registering element is formed by a transistor having characteristics sufficient to register stress.

4. A stress-detection semiconductor device as claimed in claim 3, wherein said transistor includes a PN-junction having characteristics sufficient to allow destruction of said PN-junction in response to electrostatic stress.

5. A stress-detection semiconductor device as claimed in claim 3, wherein said transistor is a MIS transistor including a gate insulation film having characteristics sufficient to allow deterioration of said gate insulation film in response to electrostatic stress.

6. A stress-detection semiconductor device as claimed in claim 1, wherein said stress registering element is formed by a diode having characteristics sufficient to register stress.

7. A stress-detection semiconductor device as claimed in claim 6, wherein said diode includes a PN-junction having characteristics sufficient to allow destruction of said PN-junction in response to electrostatic stress.

8. A stress-detection semiconductor device as claimed in claim 1, wherein said resistor is formed by a resistance area made of polycrystal silicon or tungsten silicide.

9. A stress-detection semiconductor device as claimed in claim 8, wherein said resistor has a resistance value determined by changing a width of the resistance area.

10. A stress-detection semiconductor device as claimed in claim 9, wherein said resistor has a resistance value determined by changing a length of the resistance area.

11. A stress-detection semiconductor device as claimed in claim 1, further comprising a plurality of product semiconductor devices formed on a substrate and the stress detection circuit is formed on the same substrate.

12. A stress-detection semiconductor device as claimed in 11, wherein each product semiconductor device is provided with a stress detection area on a chip of the substrate, each stress detection area having a stress detection unit formed therein.

13. A method of detecting stress applied to a product semiconductor device, said method comprising:
    providing a stress detection circuit and a product semiconductor device on a common substrate, said stress detection circuit comprising a plurality of stress detection units and at least one circuit pad connected to said stress detection units, each of said stress detection units including a resistor, a first detection unit pad connected to said resistor, and a stress registering element connected to said resistor, each said resistor having a different resistance value;
    sending the substrate having the stress detection circuit and the product semiconductor device through a plurality of production processes; and
    detecting stress that has been applied to the product semiconductor device during the production processes by measuring and comparing the characteristics of the stress registering elements of said stress detection circuit before and after each of said production processes.

14. A method as claimed in claim 13, wherein said detecting comprises measuring and comparing the characteristics of said stress registering elements before and after each of the production processes, from a wafer state to a packaged state, until the product semiconductor device is ready for shipping.

15. A method as claimed in claim 13, wherein said stress detection units each include a second detection unit pad connected to the stress registering element, and
    wherein said detecting comprises detecting a stress that has been applied to the product semiconductor device by measuring the characteristics of the stress registering element between said detection unit pads and said circuit pad.

16. A method as claimed in claim 13,
    wherein at least one of said stress registering elements includes a transistor, and
    wherein said detecting comprises detecting a stress that has been applied to the product semiconductor device during a particular production process by measuring and comparing a characteristic of the transistor before and after the particular production process.

17. A method as claimed in claim 16, wherein said transistor includes a PN-junction, and
    wherein said detecting includes determining if the PN-junction has been destroyed.

18. A method as claimed in claim 16,
    wherein said transistor is a MIS transistor including a gate insulation film, and
    wherein said detecting includes determining an amount of deterioration of the gate insulation film.

19. A method as claimed in claim 18, wherein said detecting includes measuring subthreshold characteristics of the MIS transistor.

20. A method as claimed in claim 13,
    wherein said stress registering element includes a diode, and
    wherein said detecting comprises detecting a stress applied to the product semiconductor device during a particular production process by measuring and comparing the characteristics of the diode before and after the particular production process.

21. A method as claimed in claim 20, wherein said diode includes a PN-junction, and
    wherein said detecting includes detecting destruction of the PN-junction.

22. A method as claimed in claim 13,
    wherein said resistor has a resistance area made of polycrystal silicon or tungsten silicide.

23. A method as claimed in claim 22, wherein the resistor is provided with a resistance value determined by changing a width of the resistance area.

24. A method as claimed in claim 13, wherein the resistor is provided with a resistance value determined by changing a length of the resistance area.

25. A method as claimed in claim 22, wherein a plurality of chips, each including a product semiconductor device, are provided on the common substrate.

26. A method as claimed in claim 13, wherein a plurality of chips are provided on said common substrate, each said chip including a stress detection area, and said stress detection circuit is provided in each stress detection area.

* * * * *